US006936825B2

(12) United States Patent
Gerhard et al.

(10) Patent No.: US 6,936,825 B2
(45) Date of Patent: Aug. 30, 2005

(54) PROCESS FOR THE DECONTAMINATION OF MICROLITHOGRAPHIC PROJECTION EXPOSURE DEVICES

(75) Inventors: Michael Gerhard, Aalen (DE); Nils Dieckmann, Aalen (DE); Christine Sieler, Gerstetten (DE); Marcus Zehetbauer, Oberkochen (DE); Martin Schriever, Aalen (DE); Gerd Reisinger, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 478 days.

(21) Appl. No.: 09/754,841

(22) Filed: Jan. 3, 2001

(65) Prior Publication Data

US 2001/0026402 A1 Oct. 4, 2001

Related U.S. Application Data

(63) Continuation-in-part of application No. PCT/EP99/04210, filed on Jun. 17, 1999.

(51) Int. Cl.$^7$ .......................... G01N 21/01; G01N 21/51
(52) U.S. Cl. .................... 250/431; 250/432 R; 250/428
(58) Field of Search ............................. 250/431, 432 R, 250/428, 492.2, 455.1, 451; 355/69, 68, 71; 356/401, 399

(56) References Cited

U.S. PATENT DOCUMENTS 4,028,135 A    6/1977  Vig et al.
4,149,086 A  * 4/1979  Nath ....................... 250/504 R
4,337,437 A  * 6/1982  Hunter et al. ................ 359/349
4,606,747 A  * 8/1986  Steinhoff ........................ 65/31
4,980,536 A  * 12/1990 Asch et al. ............. 219/121.68
5,024,968 A    6/1991  Engelsberg
5,430,303 A  * 7/1995  Matsumoto et al. ...... 250/492.2
5,814,156 A  * 9/1998  Elliott et al. .................... 134/1
5,821,175 A  * 10/1998 Engelsberg ................. 438/795
5,917,604 A  * 6/1999  Dirksen et al. ............. 356/401
5,938,860 A  * 8/1999  Williams ...................... 134/34
5,955,242 A  * 9/1999  Aviram et al. .............. 430/296
6,017,397 A  * 1/2000  Doran ........................... 134/1
6,038,015 A  * 3/2000  Kawata ........................ 355/67
6,191,843 B1 * 2/2001  Takiguchi ..................... 355/30
6,268,904 B1 * 7/2001  Mori et al. .................... 355/53
6,571,057 B2 * 5/2003  Aoki ............................ 396/53
6,642,994 B2 * 11/2003 Mori et al. .................... 355/53
6,762,412 B1 * 7/2004  Akagawa et al. ...... 250/363.07

FOREIGN PATENT DOCUMENTS

EP    0 297 506          1/1989
EP    0 564 264 A1      10/1993
JP    11167004       *   6/1999
WO    WO 00/03304        1/2000

* cited by examiner

Primary Examiner—John R. Lee
Assistant Examiner—Kalimah Fernandez

(57) ABSTRACT

UV light and a fluid are used in a process for the decontamination of microlithographic projection exposure devices with optical elements or portions thereof, in particular of the surfaces of optical elements. A second UV light source is directed for decontamination, in intervals between exposures, toward at least a portion of the optical elements.

21 Claims, 2 Drawing Sheets

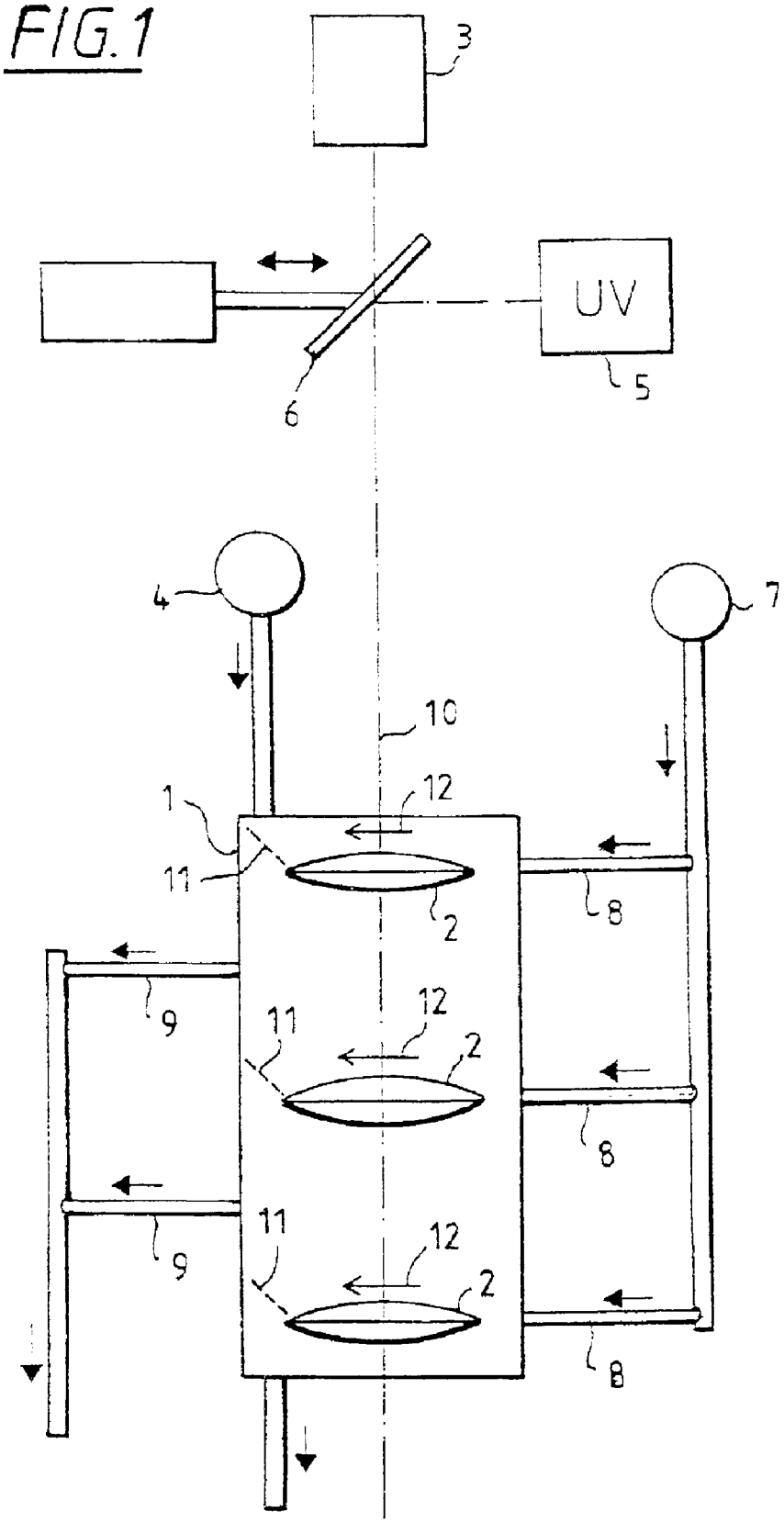

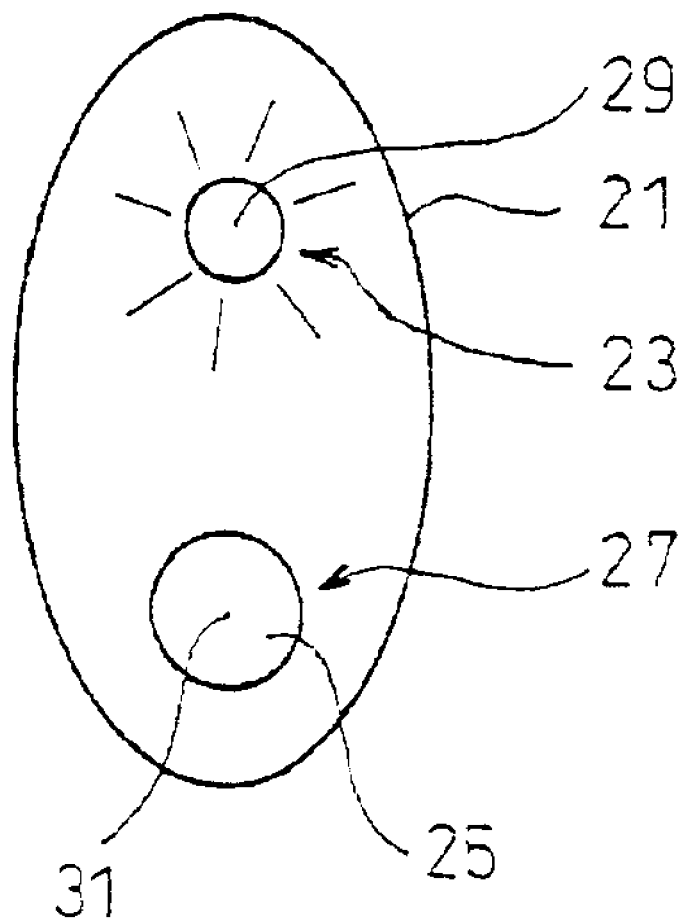

PROCESS FOR THE DECONTAMINATION OF MICROLITHOGRAPHIC PROJECTION EXPOSURE DEVICES

CROSS-REFERENCES TO RELATED APPLICATIONS

This is a continuation-in-part of application No. PCT/EP99/04210, filed Jun. 17, 1999.

STATEMENT REGARDING FEDERALLY FUNDED RESEARCH OR DEVELOPMENT

Not Applicable

REFERENCE TO A MICROFICHE APPENDIX

Not Applicable

BACKGROUND OF THE INVENTION

1. Field of the Invention

The invention relates to a process for the decontamination of microlithographic projection exposure devices having optical elements, or of portions thereof, and, more particularly, of the surfaces of optical elements, with UV light and fluid. The invention also relates to a microlithographic projection exposure device with a DUV (deep ultraviolet) excimer laser as the light source of the projection exposure. The wavelength region, about 100–300 nm, is thus included in the vacuum UV.

Impurities of substrates, e.g., quartz and calcium fluoride, on the surface become extremely noticeable due to absorption during the operation of microlithographic projection exposure devices in the deep ultraviolet region (193 nm). This can cause absorption losses of up to 5% per optical element. Such absorption losses are not acceptable, particularly for semiconductor objectives. Furthermore, quartz rods or $CaF_2$ rods are arranged in illumination devices for semiconductor objectives, to provide thorough mixing of the radiation emitted from the light source. Thorough mixing is attained by multiple total reflection of the light introduced into the glass rod or $CaF_2$ rod. If the surface of the quartz rod or $CaF_2$ rod is contaminated, absorption losses also occur there during the total reflection and lead to a weakening of the resulting illumination intensity.

2. Discussion of Relevant Art

It is known from U.S. Pat. No. 4,028,135 to clean contaminated quartz resonators and wafers with DUV light and a gas stream, particularly ozone. The light source used for the decontamination is arranged together with the surface to be cleaned in an aluminum box, the surface of which is a good reflector for UV light.

A process is described in U.S. Pat. No. 5,024,968 for the cleaning of optical components, particularly for X-ray lithography and UV excimer laser optics, the energy source for this purpose being a highly energetic radiation with a laser in combination with a flushing gas which is inert with respect to the surface. The cleaning is provided in this case for optical lenses and mirrors as individual components, such are dealt with during production.

An apparatus for microlithography is known from U.S. Pat. No. 4,820,899, and includes several lasers for the production of radiation for the projection exposure operation without interruption of the ray flux. For this purpose, the light or radiation emitted from pulsed lasers is coupled via an optical system into a projection exposure device, the radiation emitted from the respective instantaneously emitting laser(s) being coupled into the system by switching the optical system.

An apparatus for electron beam lithography is known from European Patent Document EP 297 506 A2. In this apparatus, the mask is cleaned by UV light sources which are provided for cleaning the mask, the electron beam being out of operation during the cleaning process. Different lasers, particularly krypton fluoride and xenon chloride, are provided for the decontamination of particles of different degrees of difficulty.

It is known from U.S. Pat. No. 5,430,303 that ions are produced by UV radiation. Absorption surfaces which can be exchanged are provided for the absorption of these ions. Furthermore, it is provided to carry out a nitrogen gas flushing in order to prevent particles depositing on the surface of the optical elements. It is known from European Patent Document EP 564 264 A1 to use the I line and G line of a mercury vapor lamp for microlithography.

It is known from U.S. Pat. No. 4,028,135 that a good surface cleaning can be attained by UV irradiation with simultaneous ozone flushing. It is known to provide irradiation with wavelengths of about 200 nm, particularly 184.9 nm, for the production of the ozone, and to provide radiation of about 300 nm, particularly 253 nm, for the particle removal. This cleaning process is known in particular for the cleaning of a quartz resonator before it is built into a projection exposure device.

However, the decontamination of microlithographic projection exposure devices in later operation remains a problem. Cleaning is only insufficiently attained with the DUV illumination used for exposure. Furthermore, cleaning with a UV source has heretofore been considered to be a problem, since the danger was seen of damage to coatings and materials.

SUMMARY OF THE INVENTION

The present invention therefore has as its object a process for the decontamination of microlithographic projection exposure devices of the kind initially mentioned, with which process the whole device can be decontaminated in operation or in intervals between operation, and indeed without the danger of damage to coatings or materials and without the requirement of having to interrupt the projection exposure operation of the projection exposure device.

This object is attained according to the invention by a process for decontamination of microlithographic projection exposure devices with UV light and a fluid, wherein the microlithographic projection exposure devices have optical elements, at least some of the optical elements, especially their surfaces, being cleanable, wherein the microlithographic projection exposure device has a first UV light source for projection exposure, comprising directing a second UV light source for decontamination onto at least a portion of the optical elements, especially their surfaces, in intervals between exposures by the first UV light source. The object of the invention can be constructionally attained by a microlithographic projection exposure device that comprises a first UV light source for the projection exposure, wherein the first light source comprises a DUV excimer laser, at least a second UV light source for decontamination of optical elements that is switched in alternatively in intervals between exposures by the first UV light source, by which at least a portion of the optical elements is illuminated.

Decontamination of microlithographic projection exposure devices can be carried out in a simple manner by means of the use, according to the invention, of a second UV light source. The additional UV light source can namely be matched optimally to the requirements of decontamination without the danger of damage, since it is independent of the normal illumination, and thus of the illumination in normal operation. The second light source can then also contain the laser, or parts thereof, serving for the exposure.

In a very advantageous embodiment of the invention, the second light source can, for example, be embodied with a relatively wide bandwidth and, for example, can also be operated with a relatively higher power than is the case for a normal exposure. The greater bandwidth improves the cleaning effect, since additional narrow-band transitions are excited: for example, nitrogen excitations in the Schumann-Runge band. Furthermore, the wavelength can be chosen so that problems of materials destruction, such as compaction for example, can be minimized. The wavelength is as a rule in the neighborhood of the exposure wavelength.

Projection exposure devices have a light guide in the form of a rod for homogenizing the light emitted from the light source; the radiation emitted from the light source is coupled into it, and multiple total reflections, giving a homogenization of the introduced radiation, take place at the surface of the light guide. In order to avoid absorption losses consequent on the contamination of the light guide, a UV light source is provided for irradiating it. It is possible to use a low power UV light source for a high resultant irradiation intensity at the surface of the light guide, by means of arranging the light guide to be irradiated within an ellipsoidal reflector together with the UV light source.

In an advantageous embodiment, the UV light source is arranged in a focus of the ellipsoidal reflector, and the radiation emitted from the UV light source is focused onto the other focus, at which the light guide is arranged.

Advantageous embodiments and developments of the invention will become apparent from the dependent claims and from the embodiment which is hereinafter described in principle with the aid of the drawing.

The invention is described in detail hereinafter with the aid of preferred embodiments.

BRIEF DESCRIPTION OF THE DRAWINGS

FIG. 1 shows a projection exposure device,

FIG. 2 shows a section through an exposure device.

DETAILED DESCRIPTION OF PREFERRED EMBODIMENTS

Since a microlithographic projection exposure device is known in general, only three lenses as optical elements thereof are described hereinafter, in connection with the drawing, in order to illustrate the process and apparatus for decontamination.

Several lenses 2 are arranged in a housing 1. For normal operation, the device is provided with a DUV excimer laser 3 as the light source of the projection exposure device. Furthermore, in normal operation a flushing gas supply is provided in the form of a laminar flow at the boundary; a gas supply device 4 serves for this purpose.

A further UV light source with a wide-band laser 5 is provided in addition to the laser 3. The wide-band laser 5 serves as the cleaning light source, and is coupled into the beam path by means of a mirror 6 which can be pivoted in and which is provided with a positioning mechanism, so that the lenses 2 are illuminated as uniformly as possible. Instead of coupling-in the laser 5 with the pivotable mirror 6, a partially transmissive mirror (polarizing beamsplitter, dichroic mirror) can also be provided for this purpose. The arrangement can also be provided of several light sources between the lenses of the objective, for the illumination of the surfaces to be decontaminated.

In order to remove the released contamination components, such as for example C, $CH_x$, from the closed optical system, a gas flow 12, e.g., ozone-containing gas, is produced parallel to the individual surfaces of the lenses 2 or along the lenses 2. Since such a flow would disturb the normal operation of the objective, it must be possible to turn it on and off, the minimal, diffusion-based gas exchange nevertheless taking place in normal operation by means of the gas supply device 4. For this gas supply, a flushing gas supply device 7 is provided from which the supply of flushing gas takes place from ducts 8 and radial flushing openings into the housing 1, at least approximately perpendicularly to the optical axis 10. The discharge of flushing gas together with contamination constituents takes place in the same manner through ducts 9 in the peripheral wall of the housing 1 on the side opposite to the flushing openings. A uniformly directed flow 12 over the lens surfaces is attained by means of the radial flushing openings.

Alternatively, the gas supply device 4 for normal operation can also be used for contamination flushing. For this purpose, the gas flowing parallel to the optical axis 10 can be conducted in a targeted manner over the lens surfaces, for example, by the pivoting-in of mechanical vanes 11 (shown dashed). The output of the gas supply device 4 is if necessary to be increased for this purpose, to increase the flow speed.

Another possibility for using the flushing gas supply in normal operation for contamination flushing can also consist of producing cross-flows by means of inhomogeneous magnetic or electric fields. An alternating use of flushing gases having different densities is likewise possible.

When the gas supply device 4 for normal operation is used, the gas flow is increased so that the laminar flow becomes turbulent. In this case, changes of the objective geometry (mounting) may be required in order to produce vortex flow.

The laser provided for decontamination is to be a DUV excimer laser which can operate with a bandwidth of 500 pm. The use is also possible of a UV excimer lamp, for example with 222 nm wavelength. The exposure laser without injection locking can also be used, e.g., as the cleaning laser. On the wafer side, a closure can prevent exit of light in pauses between exposures.

A light guide 25 is shown in section in FIG. 2 following the DUV excimer laser 3 as the light source of the projection exposure device, for homogenizing the radiation emitted by the light source. A quartz rod is provided as the light guide 25, and is arranged at a focus 31 of an ellipsoidal reflector 21 which surrounds it. A $CaF_2$ rod can also be used as the light guide. A UV light source 23 for irradiating the surface 27 of the light guide 25 is arranged at the further focus 29 of the reflector 21, its radiation being focused on the surface 27 of the light guide. It can be provided that the reflector has fluid flowing through it.

What is claimed is:

1. A process for decontamination of microlithographic projection exposure devices with UV light and a fluid, the microlithographic projection exposure devices having optical elements, and at least some of said optical elements being cleanable, the microlithographic projection exposure device having a first UV light source for projection exposure, comprising directing a second UV light source onto at least a portion of said optical elements in intervals between exposures by said first UV light source.

2. The process according to claim 1, comprising employing a relatively broad-band light source with a bandwidth of about 500 nm as said second UV light source.

3. The process according to claim 1, further comprising producing a flow of said fluid directed parallel to said surfaces of optical elements to be cleaned.

4. The process according to claim 3, further comprising branching off said fluid from a normal operation flushing gas supply.

5. The process according to claim 3, further comprising introducing said fluid by deflecting a fluid stream from fluid flow running parallel to an optical axis during a projection exposure operation.

6. The process according to claim 3, further comprising employing fluids with different densities alternately for flushing.

7. The process according to claim 4, further comprising producing a supply of flushing fluid from a normal operation fluid supply by increasing said supply and transition from a laminar flow into a turbulent flow.

8. Process according to claim 3, wherein the fluid comprises ozonic gas.

9. Process according to claim 3, wherein the fluid comprises oxygen gas.

10. A microlithographic projection exposure device comprising:
  a first UV light source for the projection exposure, wherein said first light source comprises a UV excimer laser,
  at least a second UV light source for decontamination of optical elements that is switched in alternatively in intervals between exposures by said first UV light source, by which at least a portion of said optical elements is illuminated.

11. The microlithographic projection exposure device according to claim 10, comprising at least one gas supply device for supply of flushing gas when said second UV light source is switched in.

12. The microlithagraphic projection exposure device according to claim 11, further comprising radial flushing openings arranged radially of an optical axis in said gas supply device for supply of flushing gas, wherein a directed flow over surfaces of optical elements to be cleaned is produced by said radial flushing openings.

13. The microlithagraphic projection exposure device according to claim 11, further comprising a gas supply device for normal operation provided as said gas supply device, a gas flow directed parallel to said optical axis being deflected in a direction toward surfaces of optical elements to be cleaned.

14. The microlithographic projection exposure device according to claim 13, further comprising mechanical vanes, pivotable or foldable for deflection, for gas flow diversion.

15. The microlithographic projection exposure device according to claim 13, further comprising a device for increasing gas flow for said flushing operation.

16. The microlithographic projection exposure device according to claim 10, wherein said gas supply device contains an ozone source.

17. The microlithographic projection exposure device according to claim 16, wherein said second UV light source is arranged in a focus of an ellipsoidal reflector, a light guide being arranged in another focus.

18. The microlithographic projection exposure device according to claim 10, wherein said optical element comprises a rod-shaped light guide, arranged within a reflector together with said second UV light source.

19. A process of a microlithographic projection exposure device comprising operating said projection exposure device comprising a plurality of optical elements with a fist ultraviolet light source and effecting exposure, and
  at intervals between exposing,
  a cleaning operation comprising applying
  a fluid and directing light from a second ultraviolet light source onto at least a portion of said plurality of optical elements.

20. A process according to claim 19, wherein said optical elements comprise surfaces,
  and the cleaning operation acting upon said surfaces.

21. A process according to claim 19, wherein said optical elements subject to said cleaning operation comprises lenses.

* * * * *